(12) United States Patent
Johnson

(10) Patent No.: US 6,831,515 B2
(45) Date of Patent: Dec. 14, 2004

(54) SLEW RATE ENHANCEMENT CIRCUIT

(75) Inventor: Jeffrey David Johnson, Tucson, AZ (US)

(73) Assignee: Texas Instruments Incorporated, Dallas, TX (US)

(*) Notice: Subject to any disclaimer, the term of this patent is extended or adjusted under 35 U.S.C. 154(b) by 398 days.

(21) Appl. No.: 10/158,625

(22) Filed: May 30, 2002

(65) Prior Publication Data
US 2004/0051585 A1 Mar. 18, 2004

(51) Int. Cl.[7] .................................................. H03F 3/45
(52) U.S. Cl. ...................................... 330/261; 330/252
(58) Field of Search ............................. 330/252, 254, 330/257, 260, 261; 327/563, 359

(56) References Cited

U.S. PATENT DOCUMENTS

| | | | |
|---|---|---|---|
| 4,636,743 A | 1/1987 | Cotreau | |
| 4,701,720 A | 10/1987 | Monticelli | |
| 4,783,637 A | 11/1988 | Cotreau | |
| 5,128,631 A | 7/1992 | Feliz et al. | |
| 5,512,859 A | * 4/1996 | Moraveji | 330/267 |
| 5,942,940 A | 8/1999 | Dreps et al. | |
| 6,225,929 B1 | 5/2001 | Beck | |
| 6,249,153 B1 | 6/2001 | Moraveji | |
| 6,724,256 B1 | * 4/2004 | Strom et al. | 330/252 |
| 6,771,126 B2 | * 8/2004 | Blankenship et al. | 330/257 |

* cited by examiner

Primary Examiner—Henry Choe
(74) Attorney, Agent, or Firm—W. Daniel Swayze, Jr.; W. James Brady; Frederick J. Telecky, Jr.

(57) ABSTRACT

An improved circuit and method is provided that can increase the slew rate of an operational amplifier without adversely affecting its response time. An operational amplifier comprises a large signal detector, a bias circuit having a bias override component, and a bias decay circuit. As a result, the operational amplifier provides the ability to control the increase in current supplied to its compensation capacitors while also providing a smooth transition to the decay phase. In accordance with an exemplary embodiment of the present invention, an exponential decay to the increased bias condition is provided.

24 Claims, 4 Drawing Sheets

SLEW RATE ENHANCEMENT CIRCUIT

FIELD OF INVENTION

The present invention relates to operational amplifier circuits. More particularly, the present invention relates to a circuit configured to enhance the slew rate of an operational amplifier.

BACKGROUND OF THE INVENTION

In today's world of high speed data transmission using electronic devices, there is an ever increasing need for improved operational amplifiers. In particular, significant efforts are being undertaken in the improvement of the response time and speed of operational amplifiers. Unfortunately, a variety of limitations are inherent in currently available operational amplifier topologies, and these limitations tend to limit the response time and speed capabilities of operational amplifiers.

Typically, operational amplifiers are configured to produce an output voltage in response to a set of input conditions. When those input conditions are modified, an operational amplifier typically responds by exhibiting a modified output voltage. A transition of an operational amplifier from an initial output state to a modified output state may be described in terms of two phases, namely a slewing phase and a decay phase. The response time of the operational amplifier is the time required for the operational amplifier to achieve a stable final output voltage in response to an instantaneous (e.g., step function) change in input conditions, i.e., to complete both the slewing phase and the decay phase.

The slewing phase of the output voltage transition begins upon the initiation of the input change and concludes when the output voltage approximates its final value. This phase is characterized by an elevated and substantially constant rate of change of output voltage with respect to time (i.e., an elevated slew rate). The decay phase begins upon the conclusion of the slewing phase and concludes when output voltage stabilizes within a tolerance range of its final value. The decay phase is typically characterized by decreasing rates of change of output voltage with respect to time. As the decay phase proceeds, the rate of change of output voltage with respect to time diminishes, and the output voltage settles.

The quickest possible slewing phase would be exhibited in an operational amplifier wherein the slewing characteristic approximates a step change, e.g., wherein the slewing time is infinitely small and the slew rate infinitely great, such as a vertical slew rate. Unfortunately, such slewing characteristics do not typically provide for a smooth transition from the slewing phase to the decay phase. Decay phases following very abrupt or steep slewing phases often exhibit instabilities, including extended oscillations about the final voltages, as well as significant overshooting of the final voltages. As a result, although a slewing phase may be accomplished relatively quickly, a decay phase following an overly fast slewing phase may be prolonged, causing an increase in response time. Accordingly, when attempting to improve response speed, increasing the slew rates, i.e. following a steep slew rate, without providing for a smooth transition to the decay phase may be counterproductive.

In a typical operational amplifier, the time required to accomplish a change in output voltage in response to a change in input voltage is directly related to the time required to change the voltage of the corresponding compensation capacitors of the operational amplifier. For a fixed current, that time is directly related to the capacitance of the compensation capacitors, which is also directly related to the stability of the amplifier. Accordingly, decreasing the capacitance of a device's compensation capacitors while maintaining the rate at which current is supplied to the compensation capacitors will typically cause an increase in the rate at which the voltage of the compensation capacitors will change, resulting in an increase in slew rate and a decrease in the time of the slewing phase.

Unfortunately, however, such modifications typically cause decreases in device stability and often increases the time required to complete the decay phase. Also, operational amplifiers are frequently used to buffer the outputs of other devices. For example, an operational amplifier may be coupled to the output of a digital-to-analog converter ("DAC") so as to buffer the output of the DAC. In such cases, the particular DAC may specify certain desired or required output buffer characteristics in terms of, for example, acceptable capacitance and/or resistive loading. Such specifications may impose additional difficulties in achieving acceptable response time and stability characteristics and may affect the response time of the output device.

Accordingly, it would be desirable to increase the rate at which current is supplied to the compensation capacitors while maintaining their capacitance. Yet the prior art does not provide and practical and effective means for increasing the current supply rate. For example, in operational amplifiers comprising class A input stages, the current that may be available to charge the compensation capacitors may be fixed by the input stage. As a result, several techniques have been developed in an attempt to augment the current supplied by the input stages. All such prior attempts, however, have resulted in various adverse effects such as increased steady-state bias, offset voltage degradation, increased device complexity, and increased power dissipation.

For example, one such effort, aimed at increasing the rate at which current is supplied to the compensation capacitors, is disclosed in U.S. Pat. No. 4,783,637 to Cotreau ("Cotreau"). The Cotreau patent describes a slew enhancement approach that employs a large signal slew enhancement stage connected in parallel to a small signal front-end stage of an operational amplifier. A parallel differential pair is used to monitor the input voltage, to detect a large signal condition, and to direct the current of the differential pair to the capacitor that most limits the response speed of the amplifier. Accordingly, when the inputs to the operational amplifier are changed, the slew enhancement stage is activated, and the slew rate of the device increases. Unfortunately, however, the Cotreau device requires an additional constant bias current for the large signal detector and requires added circuit complexity in order to steer current to the compensation capacitors.

Another attempt to improve the slew rate is disclosed in U.S. Pat. No. 4,701,720 to Monticelli ("Monticelli"). The Monticelli device detects the output condition of an operational amplifier and feeds a corresponding signal back into a bias circuit in an attempt to improve the slew rate of the amplifier. The Monticelli device uses a capacitor to couple the output signal to the bias stage to affect the bias current. Unlike the Cotreau device, which detects and responds to changes in the input condition, the Monticelli device detects and responds to changes in the output condition, which necessarily lag the changes in the input condition. Accordingly, the Monticelli device often exhibits slower response characteristics than the Cotreau device.

Accordingly, it would be advantageous to have a circuit and method for increasing the slew rate of an operational amplifier without adversely affecting the response time of the amplifier or necessitating increased circuit complexity, such as a plurality of successive slewing phases, with each successive phase exhibiting a decreased slew rate.

SUMMARY OF THE INVENTION

The method and circuit according to the present invention address many of the shortcomings of the prior art. In accordance with various aspects of the present invention, an improved method and circuit are provided which can increase the slew rate of an operational amplifier without adversely affecting its response time. The method and circuit can also provide the ability to control the increase in current supplied to the compensation capacitors while also providing a smooth transition to the decay phase.

In accordance with an exemplary embodiment of the present invention, an operational amplifier is provided with a slew rate enhancement circuit comprising a large signal detector, a bias circuit having a bias override component, and a bias decay circuit providing a continuous (i.e., smooth) decay for the bias override component. When the input to the operational amplifier changes sufficiently to exceed a predetermined threshold, the large signal detector activates the bias override component of the bias circuit, which increases the current supplied to the compensation capacitors of the operational amplifier. In this way, the large signal detector and the bias override component increase the rate at which the compensation capacitors are charged, thereby increasing the slew rate.

Once the compensation capacitors substantially achieve their desired charge state, the amplifier feedback causes the input differential signal to decrease to a level below an activation threshold of the large signal detector. Rather than immediately transitioning to a lowered slew rate in accordance with the steady-state bias of the input stage, however, a decay of the bias is provided that allows an increased slew to persist for a defined period of time and then a smooth transition to steady-state bias levels in accordance with a stable amplifier. Thus, although the exemplary slew rate enhancement circuit accommodates increased slew rate, it does so without adversely affecting the decay phase and without necessitating the implementation of a plurality of successive slewing phases with decreasing slew rates, which would increase the complexity of the device.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION

Figure 1:
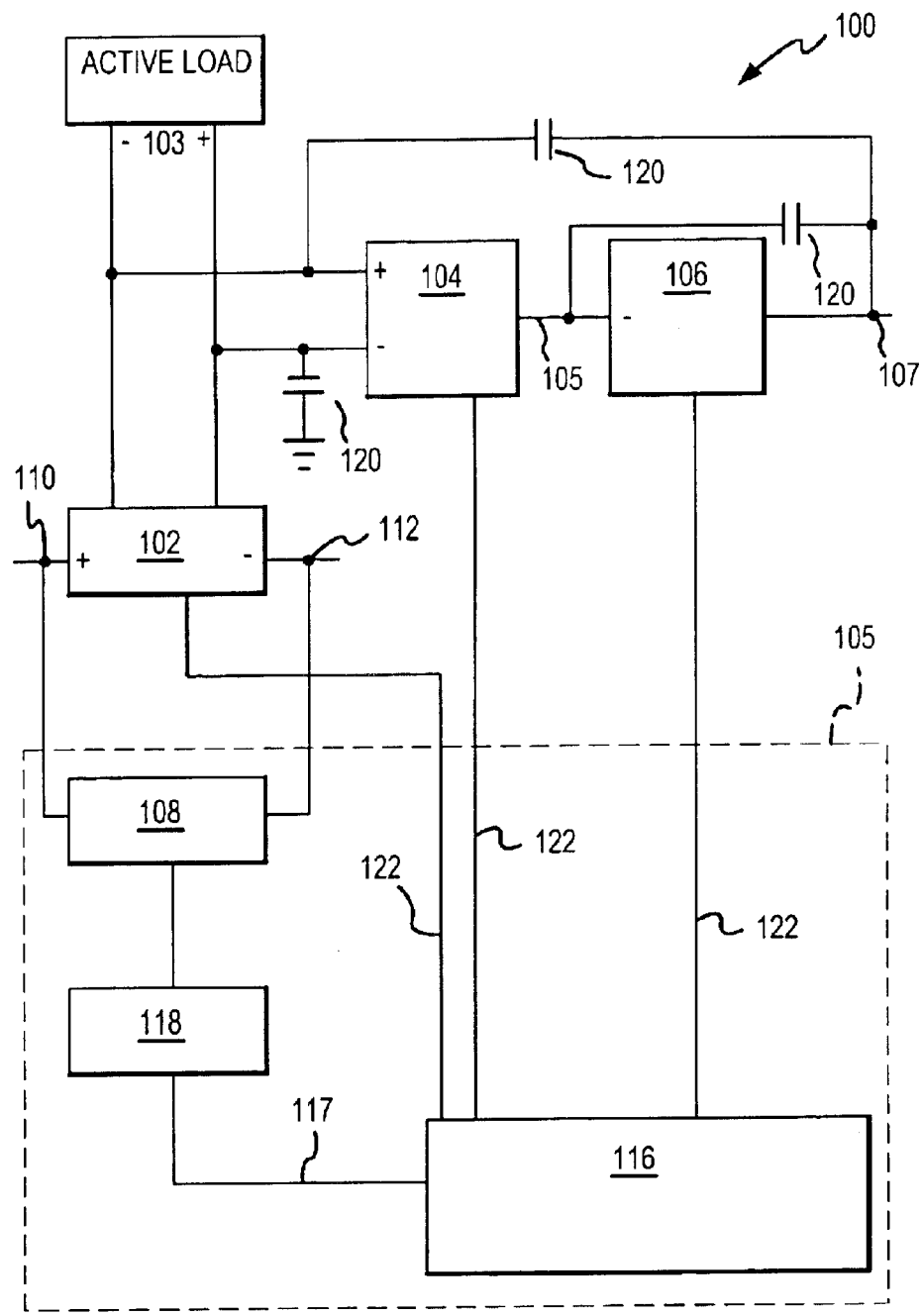
FIG. 1 illustrates a block diagram of an operational amplifier in accordance with an exemplary embodiment of the present invention.

The present invention may be described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in any integrated circuit application. Such general applications that may be appreciated by those skilled in the art in light of the present disclosure are not described in detail herein. However for purposes of illustration only, exemplary embodiments of the present invention will be described herein in connection with operational amplifiers. Further, it should be noted that while various components may be suitably coupled or connected to other components within exemplary circuits, such connections and couplings can be realized by direct connection between components, or by connection through other components and devices located thereinbetween.

As discussed above, prior art attempts at improving the response speed of operational amplifiers have focused on increasing the slew rate of the amplifier. These attempts, unfortunately, have done so at the expense of device simplicity and power dissipation. In some cases, designers have decreased the capacitance of the devices so that they may be charged very quickly. In other cases, designers have increased the rate at which current is supplied to the capacitors. In both cases, however, designers have neglected the stability of the devices, often causing increased time for the decay phase and an attendant increase in response time.

In accordance with various aspects of the present invention, however, an improved method and circuit are provided to increase the slew rate of an operational amplifier without adversely affecting the response time and speed of the amplifier. An exemplary method and circuit also provide the ability to control the increase in current supplied to the compensation capacitors while also providing a smooth transition to the decay phase.

In accordance with an exemplary embodiment of the present invention, an operational amplifier is provided with a slew rate enhancement circuit comprising a large signal detector, a bias circuit having a bias override component, and a bias decay circuit providing a continuous (i.e., smooth) decay for the bias override component. When the input to the operational amplifier changes sufficiently to exceed a predetermined threshold, the large signal detector activates the bias override component of the bias circuit, which increases the current supplied to the compensation capacitors of the operational amplifier. In this way, the large signal detector and the bias override component increase the rate at which the output capacitor is charged, thereby increasing the slew rate.

Once the compensation capacitors achieve their desired charge state, the amplifier feedback causes the input differential signal to decrease to a level below an activation threshold of the large signal detector. As a result, in the absence of a holding circuit, the bias current is allowed to decay smoothly and quickly, transitioning to, and minimizing the duration of, the decay phase. Thus, although the exemplary slew rate enhancement circuit accommodates increased slew rate, it does so without adversely affecting the decay phase or the response time of the amplifier and without necessitating the implementation of additional circuit elements, such as a plurality of successive slewing phases with decreasing slew rates, which would increase the complexity and/or power dissipation of the device.

FIG. 1 illustrates a block diagram of an exemplary operational amplifier 100 having an exemplary slew rate enhancement circuit 105. In accordance with this exemplary embodiment, operational amplifier 100 comprises a three-stage amplifier having a first stage 102, a second stage 104 and a third stage 106. First stage 102 comprises a differential input stage having an input node 110 and a reference node 112, and configured to provide differential outputs 103. Second stage 104 is configured to receive differential outputs 103 and to provide a single-ended output 105 to third stage 106. In this embodiment, third stage 106 is the output stage and has a single-ended output 107. A pair of capacitors 120 are coupled between output 107 and the inputs of second stage 104 and third stage 106.

Slew rate enhancement circuit 105 comprises a large signal detector 108, a bias circuit 116 having a bias override component, and a bias decay circuit 118 that provides a continuous (i.e., smooth) decay for the bias override component of bias circuit 116. Large signal detector 108 has a pair of input terminals coupled to input node 110 and a reference node 112 and is configured to detect when a sufficiently large differential input signal exists between input node 110 and reference node 112. The output of large signal detector 108 is coupled to the input of-decay circuit 118, whose output is coupled to bias circuit 116.

It should be noted that large signal detector 108 may comprise a simple differential pair of transistors. Preferably, large signal detector 108 comprises a plurality of transisters configured to provide one or more parallel comparator circuits. The resulting comparator circuits may further be adapted to provide substantial isolation in the deactivation state to avoid adverse effects on the circuit when slew augmentation is not required.

Decay circuit 118 is configured to enable a bias current provided to operational amplifier 100, e.g., first stage 102, second stage 104 and third stage 106, to decay smoothly and quickly to minimize the duration of the decay phase of operational amplifier 100. Finally, bias circuit 116 is coupled to second stage 104 and third stage 106. Bias circuit 116 is configured to provide augmentation currents to normal bias currents of first stage 102, second stage 104 and third stage 106 to facilitate increase of the rate of charge of capacitors 120. It should be noted that the various aspects of the exemplary slew rate enhancement circuit are not limited to three-stage amplifiers, but may be implemented in any operational amplifier in which response time and stability are important considerations.

In accordance with an exemplary embodiment, large signal detector 108 activates when a sufficiently large differential input signal exists between input node 110 and reference node 112. Such a signal occurs when the potential of input node 110 is sufficiently different (e.g., exceeds a predetermined margin) from the potential of reference node 112. The differential input signal may be positive or negative. In other words, large signal detector 108 activates based upon the magnitude of the differential input signal at input node 110 and reference node 112, independent of its polarity. Upon activation, large signal detector 108 produces an augmentation signal that causes the override component of bias circuit 116 to override the normal bias condition by providing augmentation currents 122 to first stage 102, second stage 104, and third stage 106, thereby increasing the rate at which a charge is provided to capacitors 120.

The change in voltage per unit time across capacitors 120 is inversely proportional to the capacitance of capacitors 120 and is directly proportional to the current supplied to capacitors 120. Thus, for a defined capacitance, the rate at which charge is supplied to capacitors 120 determines the rate at which the potential across capacitors 120, and thus the potential of output 107, may change. By providing augmentation currents 122, bias circuit 116 increases the rate at which charge is added to capacitors 120, and consequently, increases the slew rate of amplifier 100. In an exemplary embodiment, a nominal amplifier bias current may be approximately 40 microamps. However, augmentation currents 122 may increase such nominal bias currents of approximately 40 microamps to an augmented level, for example a level of approximately 150 microamps.

Once capacitors 120 have achieved their desired charge state (i.e., when the output from external feedback mechanisms—not shown—causes the potential of input 112 to be approximately equal to the potential of input node 110) and the differential signal between input node 110 and reference node 112 has decreased to a level below the activation threshold of large signal detector 108, decay circuit 118 will remain activated for a period of time sufficient to enable the output voltage to continue to change at a substantially elevated rate. The bias circuit 116 decays smoothly to a steady-state bias while the differential signal between node 110 and node 112 transitions from below the activation threshold of 102 to a steady-state wherein the potentials of nodes 110 and 112 are substantially equal.

In accordance with another exemplary embodiment, a holding circuit may also be implemented to delay the transition to the decay phase until a time after the differential signal falls below the activation threshold. An exemplary holding circuit may comprise a capacitive network configured to delay the collapse in bias circuit 116, thereby continuing the augmentation of the current applied to compensation capacitors 120 and allowing compensation capacitors 120 to more smoothly transition to their final value. Accordingly, such an exemplary holding circuit may further improve the total response time and speed of amplifier 100.

Bias decay circuit 118 is configured to provide a substantially smooth bias decay characteristic such as an exponential decay characteristic, a geometric decay characteristic, or a linear decay characteristic. For example, decay circuit 118 may comprise a network of capacitors and/or inductors and resistors or alternatively may comprise a gate delay circuit. In an exemplary embodiment, decay circuit 118 may comprise an RC decay block. The RC decay block may be configured as a simple RC parallel combination with a capacitor controlling the exponential decay of a charge over time. It should be noted that the values of the resistor and the capacitor may be chosen such that the decay of the bias current exhibits a time constant, or a decay rate, that is quick enough to ensure the achievement of stability within the response time specification, while being sufficiently long to overcome the lower nominal bias and limited slew capability of the amplifier.

Bias circuit 116 may be configured to provide a fixed level of bias enhancement in augmentation currents 122, or may be varied according to a predetermined schedule or based on a logical response to feedback signals received from slew rate enhancement circuit 105. For example, in an exemplary embodiment, the bias enhancement may be varied in response to a signal 117 received from a decay circuit 118, such as an RC network, so as to smoothly (e.g., continuously) decay, ensuring a substantially smooth transition from the slewing condition to an equilibrium small signal control of operational amplifier 100.

Figure 2:
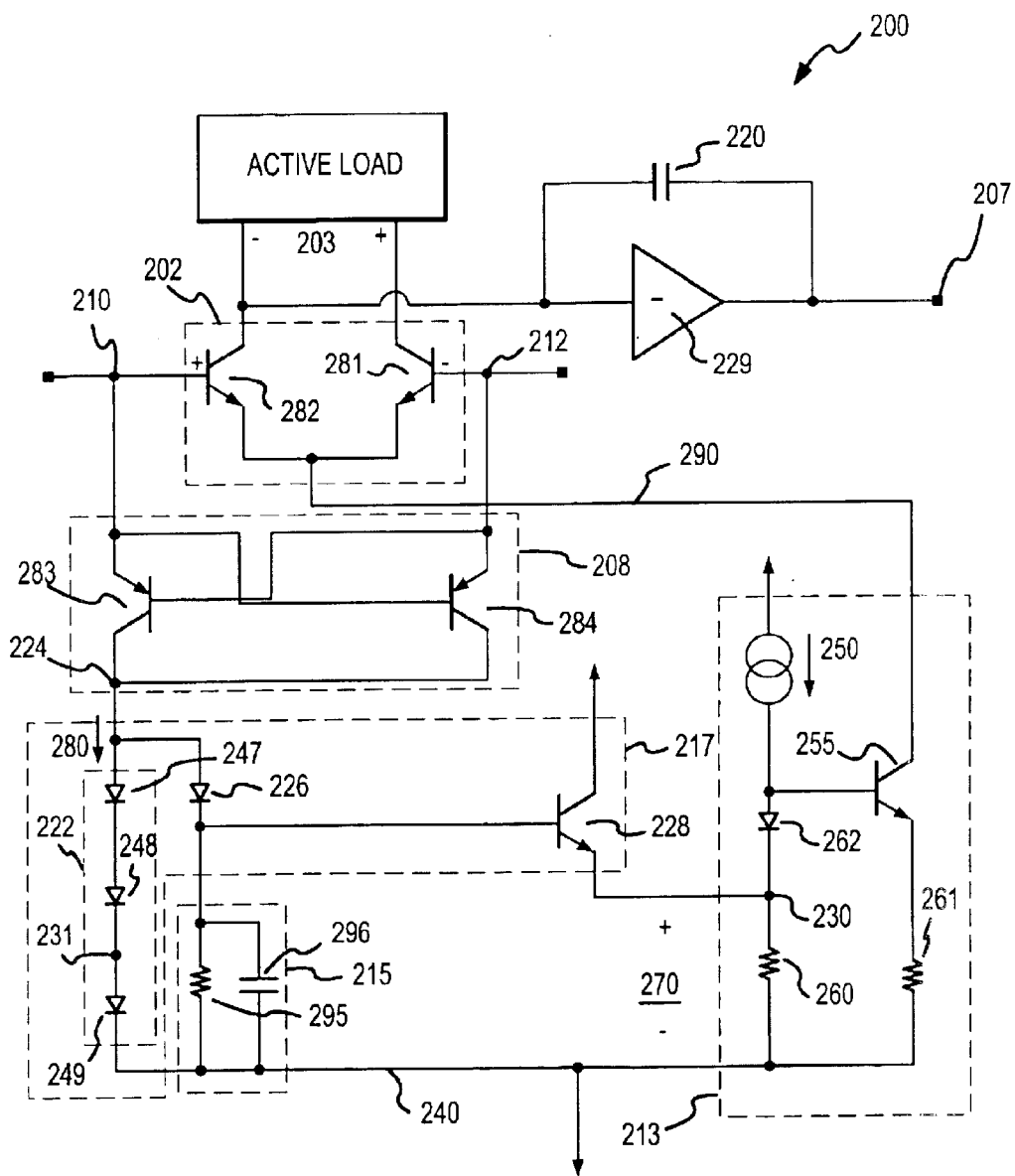
FIG. 2 illustrates a schematic diagram of an operational amplifier in accordance with an exemplary embodiment of the present invention.

With reference to FIG. 2, in accordance with another exemplary embodiment of the present invention, an operational amplifier 200 is illustrated with an exemplary slew rate enhancement circuit. Operational amplifier 200 comprises an input stage 202 and an output stage 229. Input stage 202 comprises a differential amplifier including NPN differential pair transistors 281 and 282. The base of transistor 282 is configured as an input node 210, while the base of transistor 281 is configured as a reference node 212. The emitter of transistor 281 is coupled to the emitter of transistor 282. The collectors of transistors 281 and 282 are coupled to an active load device. In addition, the collector of transistor 281 is coupled to the input of output stage 229 as well as to output 207 of output stage 229 through a feedback compensation capacitor 220.

The slew rate enhancement circuit comprises a large signal detector 208, a bias decay circuit 215, a bias override component 217, and a bias circuit 213. Large signal detector 208 comprises PNP transistors 283 and 284. In this embodiment, the base of transistor 283 is coupled to both the emitter of transistor 284 and reference node 212 of input stage 202. Similarly, the base of transistor 284 is coupled to both the emitter of transistor 283 and input node 210 of input stage 202. The collectors of transistors 283 and 284 are coupled to form an output node 224 of large signal detector 208. It should be noted that large signal detector 208 may comprise transistors such as bipolar junction transistors or field effect transistors. In accordance with the exemplary embodiment, transistors 283 and 284 comprise a bi-directional large signal detector. An output current 280 is activated when the absolute value of the potential of input node 210 exceeds the potential of reference node 212. Output current 280 is configured to activate bias override component 217 and augment the nominal currents of bias circuit 213. The emitter of transistor 283 is coupled to the base of transistor 284, and the emitter of transistor 284 is coupled to the base of transistor 283. In addition, the emitter of transistor 283 is coupled to input node 210, and the emitter of transistor 284 is coupled to reference node 212.

Bias override component 217 comprises a diode stack 222, an output diode 226, and a follower transistor 228. Diode stack 222 suitably comprises a plurality of diodes, such as a first diode 247, a second diode 248, and a third diode 249. An output node 224 of diode stack 222 is coupled through output diode 226, which can comprise any diode configuration, to the base of follower transistor 228. Follower transistor 228 may comprise a transistor such as a bipolar junction transistor or a field effect transistor.

Bias circuit 213 comprises a biasing transistor 255 and is configured to provide an enhanced bias current to operational amplifier 200 to facilitate increased slewing. Biasing transistor 255 comprises an NPN transistor having a collector coupled to the emitters of transistors 281 and 282. The emitter of biasing transistor 255 is coupled through a resistor 261 to a negative supply rail 240. The base of biasing transistor 255 is coupled to current source 250 as well as the anode of diode 262, whose cathode is coupled to a bias override node 230 and is coupled to negative rail 240 through resistor 260. Bias override node 230 is coupled to bias override component 217 through an emitter of follower transistor 228.

Bias decay circuit 215 comprises an RC delay circuit comprising a decay resistor 295 and a decay capacitor 296. Bias decay circuit 215 is configured to facilitate a substantially smooth bias delay characteristic to provide stability during transient operation of operational amplifier 200. Decay resistor 295 and decay capacitor 296 define an exponential decay for the bias boost to be provided to operational amplifier 200. The values of resistor 295 and capacitor 296 can be suitably varied depending upon any given design criteria to provide a suitable bias delay characteristic.

During operation, when the absolute value of the difference between the potentials of input node 210 and reference node 212 exceeds a predetermined large signal threshold value, at least one of transistor 283 and transistor 284 is activated and current is applied to diode stack 222. In response to an input signal from large signal detector 208, a rise in voltage will be exhibited at a diode stack output node 224 corresponding to the potential across diode stack 222, with output node 224 being coupled through output diode 226 to the base of follower 228. As a result, the emitter of follower 228 causes a bias override node 230 to exhibit a potential approximately equal to the potential of node 231, which is coupled to the anode of diode 249.

It should be noted that under nominal conditions such as when the large signal detector 208 is not activated, the potential of bias override node 230 exhibits a nominal bias determined by the product of the current of a current source 250 and the resistance of resistor 260. Put another way, nominally, the potential of differential voltage 270 is exhibited by bias override node 230 and is proportional to the current of source 250, which biases first stage 202. However, when large signal detector 208 is activated, the potential of differential voltage 270 is biased to the potential of node 231 when the diode stack is activated. For example, in response a difference in potential between input node 210 and reference node 212, large signal detector 208 activates bias override 217 of bias circuit 213, thereby causing an immediate increase in the collector current of NPN transistor 255. This increased current can be maintained throughout the slewing phase, when large signal detector 208 detects that the output voltage at output terminal 207 has reached, within a predetermined tolerance, a desired output voltage.

As discussed above, follower 228 is configured to increase the potential of bias override node 230 to a level approximately equal to the potential of node 231. Bias current 290 is suitably boosted by a factor approximately equal to the potential of 231 with respect to the potential of negative supply rail 240, occurring when the diode stack is activated, divided by the nominal differential voltage 270. Decay resistor 295 and decay capacitor 296 define an exponential decay for the bias boost so that after the absolute value of the differential potential between inputs 210 and 212 falls below the activation potential of the large signal detector 208, substantially elevated bias current will remain available to input stage 202 to enable the substantially elevated charging current to compensation capacitor 220. Consequently, the potential at output 207 of output stage 229 may transition to a substantially stable final output state 210 within a desired response time.

Figure 3A:
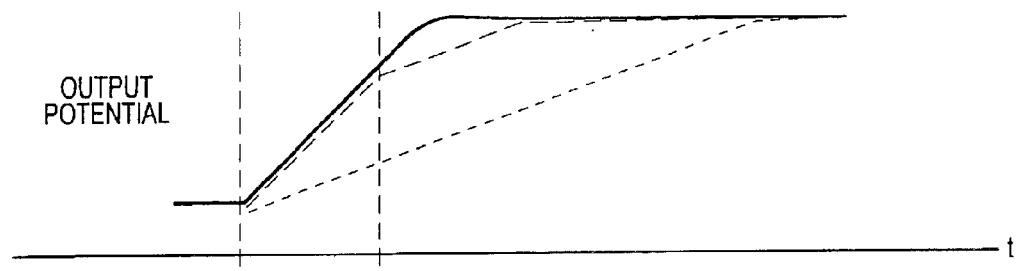
FIGS. 3a–c illustrate response characteristics of an operational amplifier in accordance with an exemplary embodiment of the present invention.
Figure 3B:
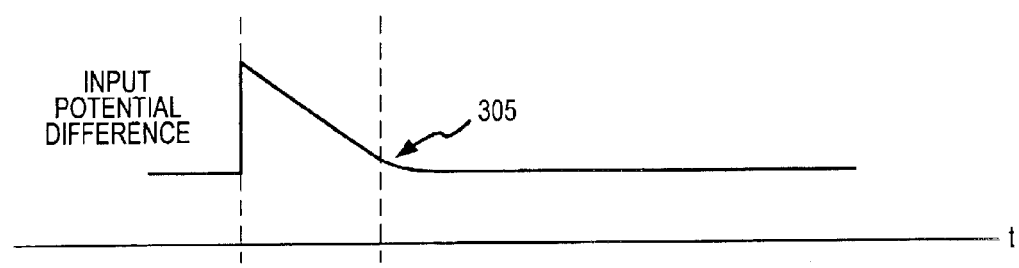
Figure 3C:
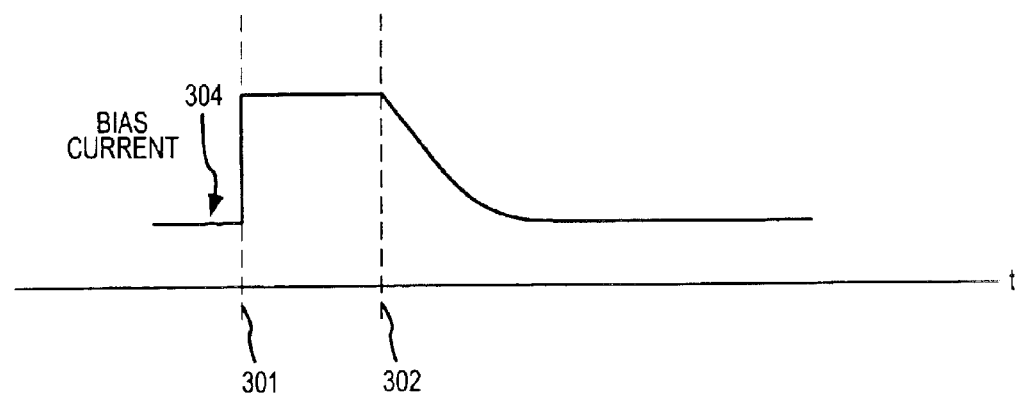

To further understand the operation of slew rate enhancement circuit within operational amplifier 200, in accordance with an exemplary embodiment of the present invention, the slew enhancement circuit may exhibit characteristics as depicted by the three wave forms sections shown in the FIGS. 3a–c. FIG. 3a depicts the output voltage characteristics for operational amplifiers including a conventional operational amplifier having no slew enhancement features, an operational amplifier having a slew enhancement feature but no bias decay features, and an operational amplifier having a bias decay feature in accordance with an exemplary embodiment of the present invention. In FIG. 3a, the short-dashed-line depicts a slew performance characteristic for a conventional system without any override, e.g., no bias circuit enhancement circuit, large signal detector, or RC decay circuit. It should be noted that this characteristic represents a relatively low slew rate. Also in FIG. 3a, the long-dashed-line depicts an enhanced slew rate characteristic followed by a less steep slew characteristic such as exhibited by the prior art. It should be noted that this characteristic corresponds to an initially elevated slew rate characteristic followed by a relatively low slew rate. Finally, the solid line of FIG. 3a depicts an exemplary performance characteristic in accordance with an exemplary embodiment of a slew rate enhancement circuit of the present invention. It should be noted that the enhanced slew rate characteristic corresponds to an elevated slew rate followed by a continuous, i.e., smooth, transition to an exponentially decaying slew rate. Accordingly, as depicted in FIG. 3a, the exemplary performance characteristic corresponds to a higher output voltage at any given time relative to the output voltage of the conventional slew rates of prior art characteristic.

FIG. 3b depicts the difference in potential between input node 210 and reference node 212, which exhibits a step change (e.g., instantaneous voltage shift) characteristic at an initial time 301. As shown in FIG. 3b, the input potential difference decreases at a substantially constant rate between time 301 and time 302. Then, after time 302, the rate of decrease of the input potential difference decreases in accordance with the decay phase.

FIG. 3c depicts the collector current of NPN transistor 255. In response to the step in potential between input node 210 and reference node 212 occurring at time 301, large signal detector 208 activates bias override component 217 of bias circuit 213, thereby causing an immediate increase in the collector current of NPN transistor 255. This maximum current is maintained throughout the slewing phase, which terminates at transition time 302, when large signal detector 208 detects that the output voltage has reached, within a predetermined tolerance, a desired output voltage corresponding to the input voltage 305 that activates the large signal detector. Accordingly, after transition time 302, the collector current of NPN transistor 255 is permitted to decay to the nominal current 304.

Figure 4:
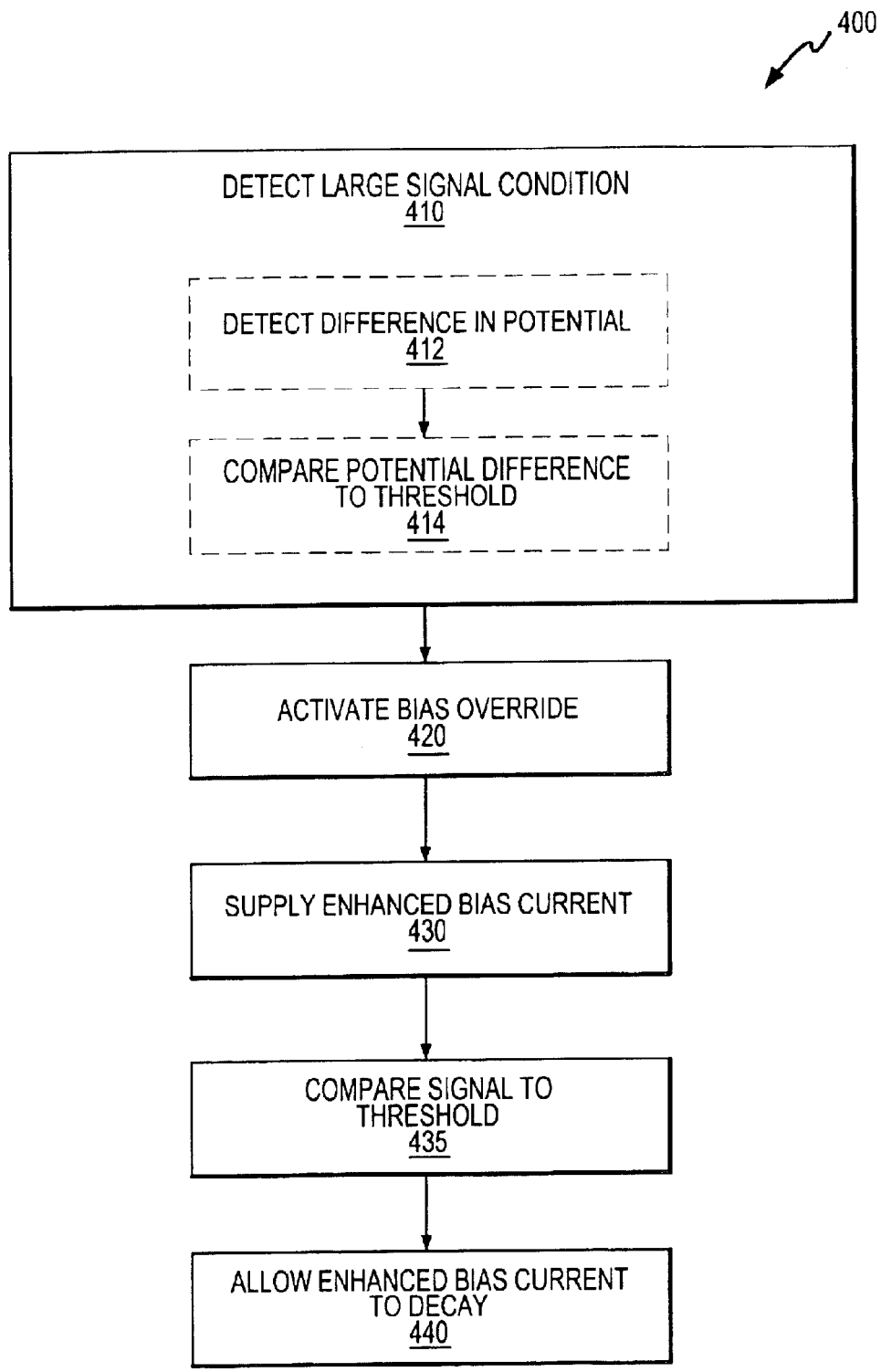
FIG. 4 illustrates an exemplary method for enhancing the slew rate of an operational amplifier.

With reference to FIG. 4, in accordance with another aspect of the present invention, an improved method is provided for enhancing the slew rate of an operational amplifier while providing an enhanced decay characteristic for the amplifier. In accordance with an exemplary embodiment, an exemplary slew rate enhancement method 400 provides for detecting a large signal condition (step 410). The large signal condition is characterized by a sufficient difference in potential between input and reference nodes to the amplifier. Accordingly, the step of detecting a large signal condition (step 410) includes the steps of detecting a difference in potential between input and reference nodes to the operational amplifier (step 412) and comparing said difference to a predetermined threshold (step 414).

The method of this embodiment also provides for activating a bias override component to provide an enhanced bias current in response to the detected large signal condition (step 420). The enhanced bias current is supplied to the operational amplifier stages and maintained to enable the amplifier to slew to the final output value (step 430). When the capacitors achieve their desired charge state, as sensed by the amplifier feedback, and as also indicated by the associated decrease of the input differential signal to a level below the activation threshold of the large signal detector, the method provides for allowing the enhanced bias current to decay (step 440). The decay in the enhanced bias current to the operational amplifier stages is allowed to occur smoothly and quickly so that the transitioning to, and the duration of, the decay phase is minimized. In accordance with an exemplary embodiment, the decay in the enhanced bias current is accomplished according to an exponential characteristic of bias current as a function of time. In accordance with another exemplary embodiment, the decay in the enhanced bias current is accomplished according to a geometric characteristic of bias current as a function of time. Accordingly, the exemplary slew rate enhancement method accommodates increased slew rate without adversely affecting the decay phase or the response time of the amplifier and without necessitating a series of steps of successively decreasing slew rates.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by providing other pin layouts or arrangements, and/or additional or fewer passive devices. Further, an exemplary slew rate enhancement circuit can include field effect transistors. Similarly, the steps described in the methods disclosed herein are not limited to the particular order in which they are described. For example, various of the steps may be modified repeated and or otherwise executed in a different order. These alternatives can be suitably selected depending upon the particular application or in consideration of any number of factors associated with the operation of the system. Moreover, these and other changes or modifications are intended to be included within the scope of the present invention, as expressed in the following claims.

What is claimed is:

1. An operational amplifier comprising:
   an input stage configured for receiving an input signal and reference signal;
   an output stage for providing an output signal;
   a large signal detector configured for determining a difference between the input signal and the reference signal and for providing an output signal corresponding to the difference between the input signal and the reference signal;
   a bias circuit having a bias override component, the bias circuit coupled to the output stage and configured to provide an enhanced bias current to facilitate slewing of the operational amplifier; and
   a bias decay circuit coupled to the large signal detector and the bias circuit and configured to facilitate decaying of the enhanced bias current.

2. The operational amplifier according to claim 1, said bias override component comprising a transistor responsive to changes in the output signal of the large signal detector, said bias override component being configured to provide the enhance bias current.

3. The operational amplifier according to claim 1, said bias decay circuit configured to produce an exponential decay characteristic in the enhance bias current produced by the bias override component.

4. The operational amplifier according to claim 1, said bias decay circuit configured to produce a geometric decay characteristic in the enhance bias current produced by the bias override component.

5. The operational amplifier according to claim 1, said bias decay circuit comprising a digital gate delay.

6. The operational amplifier according to claim 1, said bias decay circuit comprising an RC network.

7. The operational amplifier according to claim 1, said large signal detector comprising two or more transistors, each said transistor having a collector, the collectors of said transistors coupled to form an output node.

8. The operational amplifier according to claim 7, said large signal detector comprising two or more transistors coupled to form at least one parallel differential pair.

9. The operational amplifier according to claim 7, said large signal detector comprising two or more transistors coupled to form at least one parallel comparator circuit.

10. The operational amplifier according to claim 9, said parallel comparator circuit adapted to provide substantial isolation from the remainder of the operational amplifier circuit when slew augmentation is not required.

11. A circuit for enhancing the slew rate of an operational amplifier comprising:

a large signal detector configured for determining a difference between an input signal and a reference signal and for providing an output signal corresponding to the difference between the input signal and the reference signal;

a bias circuit having a bias override component, the bias circuit coupled to an output stage of the operational amplifier and configured to provide an enhanced bias current to facilitate slewing of the operational amplifier; and a bias decay circuit coupled to the large signal detector and the bias circuit and configured to facilitate decaying of the enhanced bias current.

12. The circuit according to claim 11, said bias override component comprising a transistor responsive to changes in the output signal of the large signal detector, said bias override component being configured to provide the enhance bias current.

13. The circuit according to claim 11, said bias decay circuit configured to produce an exponential decay characteristic in the enhance bias current produced by the bias override component.

14. The circuit according to claim 11, said bias decay circuit configured to produce a geometric decay characteristic in the enhance bias current produced by the bias override component.

15. The circuit according to claim 11, said bias decay circuit comprising a digital gate delay.

16. The circuit according to claim 11, said bias decay circuit comprising an RC network.

17. The circuit according to claim 11, said large signal detector comprising two or more transistors, each said transistor having a collector, the collectors of said transistors coupled to form an output node.

18. The circuit according to claim 17, said large signal detector comprising two or more transistors coupled to form at least one parallel differential pair.

19. The circuit according to claim 17, said large signal detector comprising two or more transistors coupled to form at least one parallel comparator circuit.

20. The circuit according to claim 19, said parallel comparator circuit adapted to provide substantial isolation from the remainder of the operational amplifier when slew augmentation is not required.

21. A method of improving the response time and speed of an operational amplifier comprising the steps of:

detecting a difference in potential between input and reference nodes to the amplifier, comparing said difference to a predetermined threshold, activating a bias override component to provide a biasing current, and allowing the bias of said bias override component to decay.

22. The method according to claim 21, said bias override component comprising a transistor configured to respond to changes in the output of a large signal detector.

23. The method according to claim 21, said step of allowing performed using a bias decay circuit.

24. The method according to claim 21, said bias decay circuit configured to produce an exponential decay characteristic in the bias of said bias override component with respect to time.

* * * * *